United States Patent [19]

Burlingame et al.

[11] Patent Number: 4,677,436
[45] Date of Patent: Jun. 30, 1987

[54] EXPANDABLE ELECTRONIC MATRIX

[75] Inventors: Christopher M. Burlingame, Northlake, Ill.; Thomas J. Perry, Phoenix, Ariz.

[73] Assignee: GTE Communication Systems Corporation, Phoenix, Ariz.

[21] Appl. No.: 604,762

[22] Filed: Apr. 27, 1984

[51] Int. Cl.⁴ ............................................. H04Q 1/00
[52] U.S. Cl. .............................. 340/825.79; 340/825.8
[58] Field of Search ..................... 340/825.79–825.9; 307/465; 361/416, 412, 417, 400, 409, 410, 413; 339/17 LC, 17 M

[56] References Cited

U.S. PATENT DOCUMENTS

| | | | |
|---|---|---|---|
| 3,242,385 | 3/1966 | Steeneck | 361/416 X |
| 3,662,345 | 5/1972 | Shinohara et al. | 340/825.89 X |
| 3,824,433 | 7/1974 | Newton | 361/409 X |
| 4,124,899 | 11/1978 | Birkner et al. | 307/465 |

Primary Examiner—Ulysses Weldon
Attorney, Agent, or Firm—Anthony Miologos; Peter Xiarhos

[57] ABSTRACT

An arrangement for connecting an array of individual electronic elements into a readily expandable matrix. The arrangement comprises a plurality of matrix slices with each slice including a set number of electronic elements as well as a row and a column buffer. The electronic elements of each matrix slice are diagonally connected to the elements of the adjacent matrix slice.

4 Claims, 8 Drawing Figures

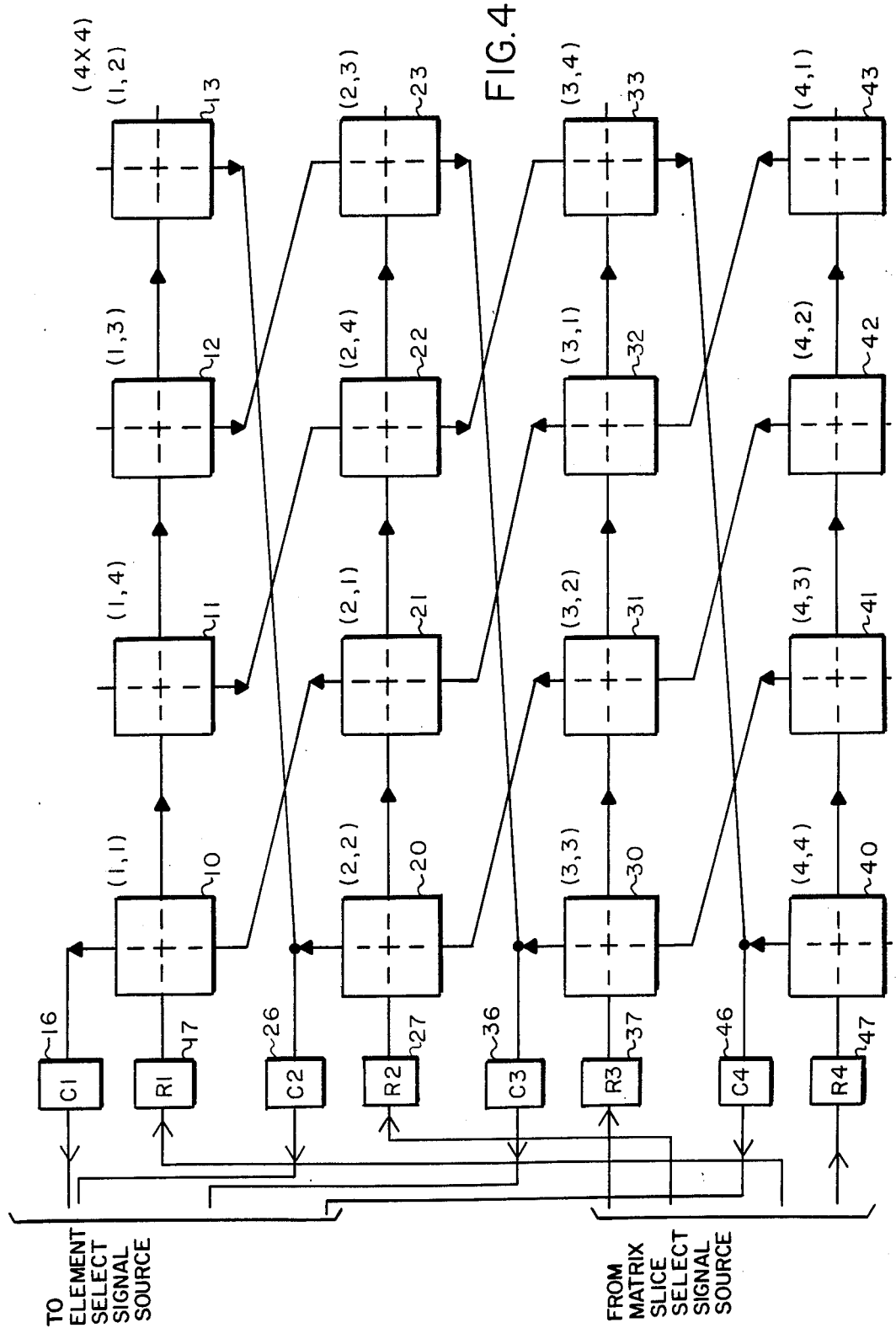

4,677,436

EXPANDABLE ELECTRONIC MATRIX

CROSS-REFERENCE TO RELATED APPLICATION

The present application is related to co-pending U.S. patent application Ser. No. 604,766, titled "An Interconnect Arrangement for an Expandable Electronic Matrix" having the same inventive entity and being assigned to the same assignee.

BACKGROUND OF THE INVENTION

This invention relates in general to matrix arrays of electronic elements and more particularly to a partitioning arrangement for interconnecting an array of individual electronic elements into a readily expandable matrix.

In a number of electronic applications a matrix method is used to access one element out of many elements. The most historical application of this method is in memories. That is, a plurality of storage elements are interconnected to each other horizontally in rows and vertically in columns. Interconnecting buses running horizontally interconnect the rows while buses running vertically interconnect the columns. Typically, these buses are extended to a remote device via buffers (drivers and/or receivers) which are normally located at the ends of the buses.

This type of architecture does not readily lend itself to the expansion of the matrix by simply adding additional storage elements. The interconnection buses must be sized to a particular matrix size and the required amount of buffers physically added to the matrix to access each storage element. Therefore, a matrix of this type is normally designed and configured for maximum size. In designing such matrix arrays it would be more cost effective to start with a minimally sized matrix and add elements to the matrix as the needs of the system requires them.

Accordingly, it is the object of the present invention to provide a partitioning arrangement for interconnecting a plurality of individual electronic elements into a readily expandable matrix.

SUMMARY OF THE INVENTION

In accomplishing the objects of the present invention there is provided a matrix of electronic elements comprising a first matrix slice including at least a first and a last electronic element connected serially one to the other. A first matrix slice row buffer is connected to a source of matrix slice select signals and to the first electronic element. The first row buffer is arranged to select the first matrix slice responsive to the application of a matrix slice select signal. A second column buffer is connected to a source of element select signals and to the first electronic element. The second column buffer selects the first element in response to the application of an element select signal when the matrix slice select signal is applied.

At least one additional matrix slice including at least a first and a last electronic element is connected to the first matrix slice by diagonally connecting the additional matrix slice first element to the first matrix slice last element and the additional matrix slice last element to the first matix slice first element.

The additional matrix slice further includes a row buffer connected to a source of matrix slice select signals and to the additional matrix slice first element. The additional matrix slice is selected responsive to the application of a matrix select signal. An additional matrix slice column buffer is connected to the source of element select signals and to the additional matrix slice first element. Responsive to the application of an element select signal, the additional matrix slice first element is selected. Accordingly, the additional matrix slice last electronic element is selected in resporse to a matrix slice signal applied to the additional matrix slice row buffer and an element select signal applied to the first matrix slice last column buffer. The first matrix slice last electronic element is selected responsive to the application of a matrix slice select signal applied to the first matrix slice row buffer and an element select signal applied to the additional matrix slice column buffer.

It should be noted that even though the explanation given in the summary is for a four element matrix, any size matrix may be configured by the simple addition of electronic elements within the slice and slices to the matrix.

DESCRIPTION OF THE DRAWING

FIG. 4 is a schematic representation of the interconnection arrangement for a 4×4 matrix employing four matrix slices in accordance with the present invention.

DESCRIPTION OF THE PREFERRED EMBODIMENT

Figure 1:
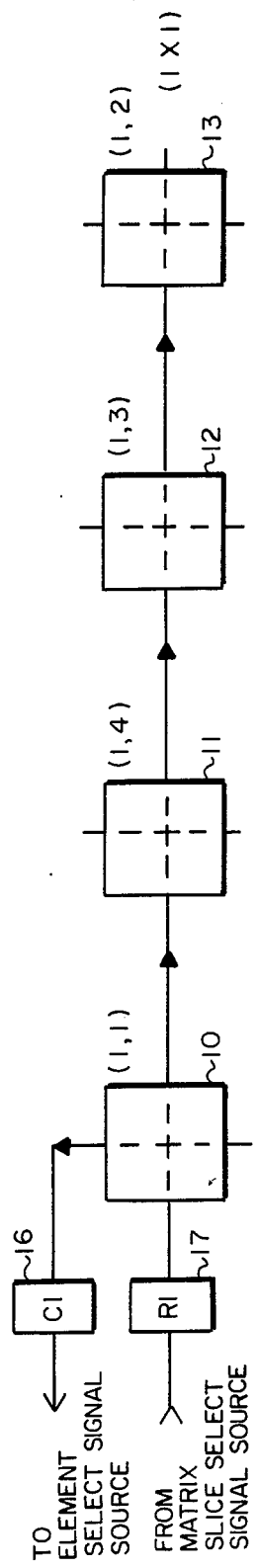
FIG. 1 is a schematic representation of the matrix slice in accordance with the present invention.

Turning now to FIG. 1, the basic matrix slice of the present invention is illustrated. As can be seen the matrix slice is comprised of a row buffer 17, a column buffer 16 and four matrix elements 10, 11, 12 and 13. The row and column buffers 17 and 16, respectively, normally interface the matrix slice to a remote device. It should be noted that the matrix elements may be of different varieties (logic gates, switch devices, etc.) and will be explained as memory elements in this embodiment since this is the most common historical use of a matrix array. It should also be noted, that the matrix slice illustrated may include more than four elements, depending upon the final growth or maximum size of the matrix. Four elements per slice is illustrated in this embodiment for ease of explanation.

Figures 1A, 2A, 3A, 4A:
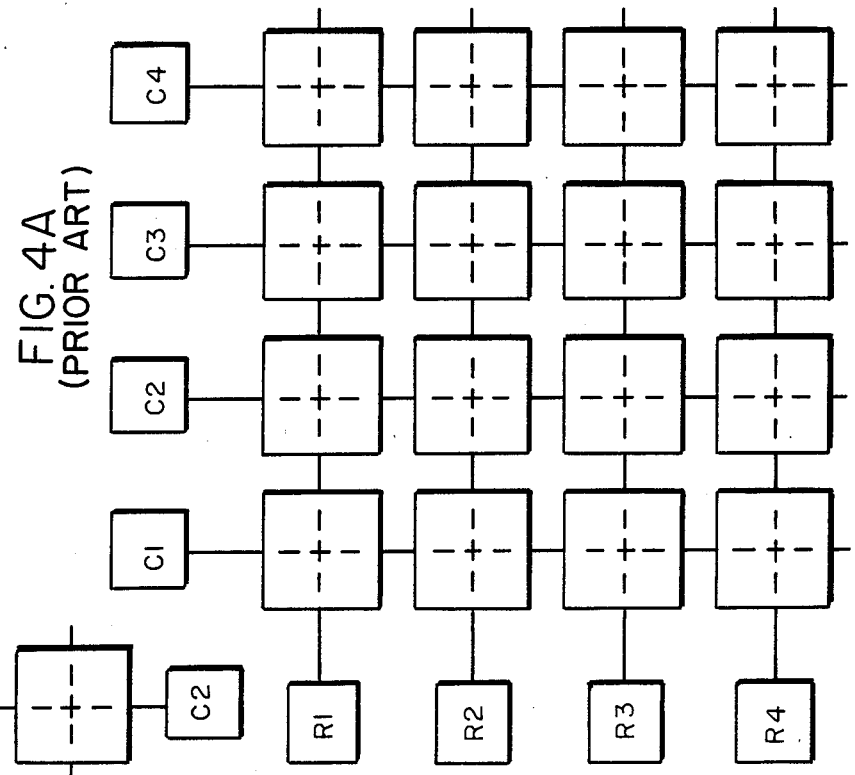
FIG. 1A is a schematic representation of the prior art method of configuring the matrix of FIG. 1.
FIG. 2A is a schematic representation of the prior art arrangement of configuring a 2×2 matrix.
FIG. 3A is a schematic representation of the prior art arrangement for configuring a 3×3 matrix.
FIG. 4A is a schematic representation of the prior art arrangement for configuring a 4×4 matrix.

In the first slice as can be readily seen only one element, element 10 is usable as conventionally represented by FIG. 1A, via row and column buffers 17 and 16. The other elements 11, 12 and 13 will be usable as the matrix grows to its full size. For example, element 11 will eventually be the row 1 column 4 element, element 12 the row 1 column 3 element and element 13 the row 1 column 2 element.

Figure 2:
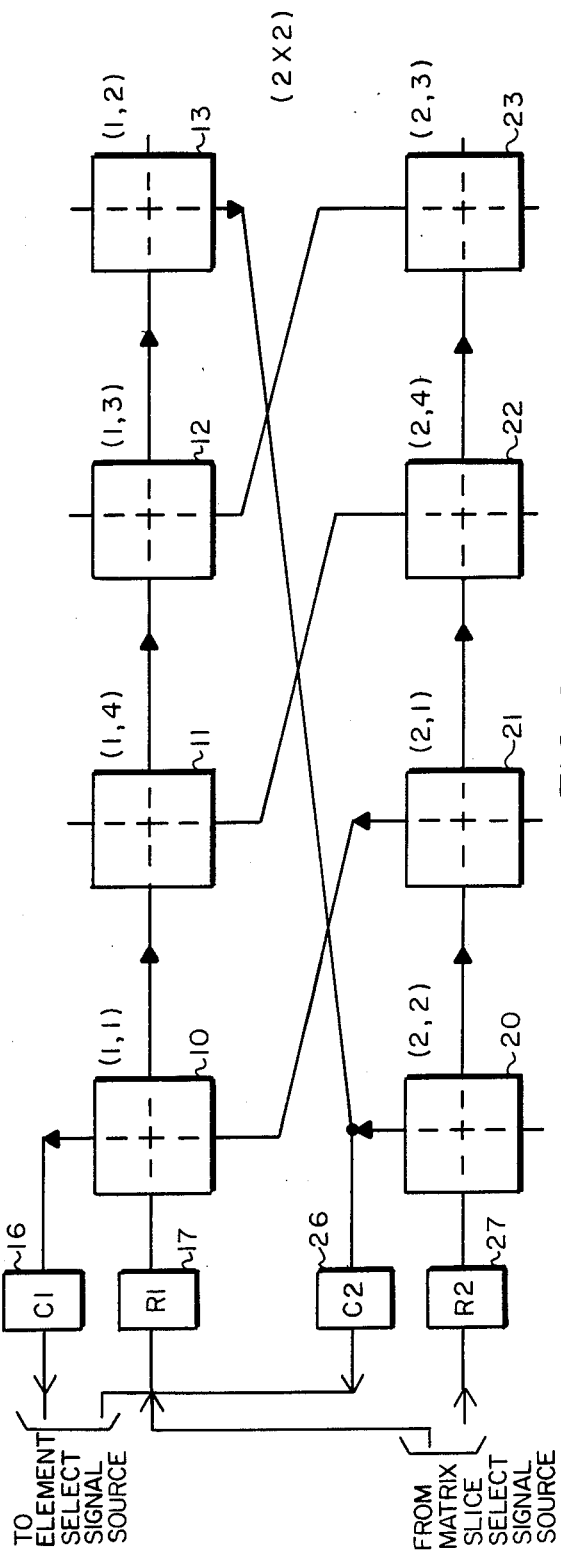
FIG. 2 is a schematic representation of the interconnection arrangement for a 2×2 matrix employing two matrix slices in accordance with the present invention.

By the addition of a second identical slice to that of FIG. 1, a 2×2 matrix as represented in FIG. 2A can be configured. Turning to FIG. 2, a 2×2 matrix is shown. The second slice including a column buffer 26, a row buffer 27 and elements 20, 21, 22 and 23 are connected to the first slice via diagonal buses with the last element 13 of the first slice folded back to the first element 20 of the second slice. The addressable elements in this embodiment are the row 1 elements 10 and 13 and the row 2 elements 20 and 21. Therefore, only four elements out of the eight elements available in a 2×2 matrix can be directly accessed by the row and column buffers provided.

Figure 3:
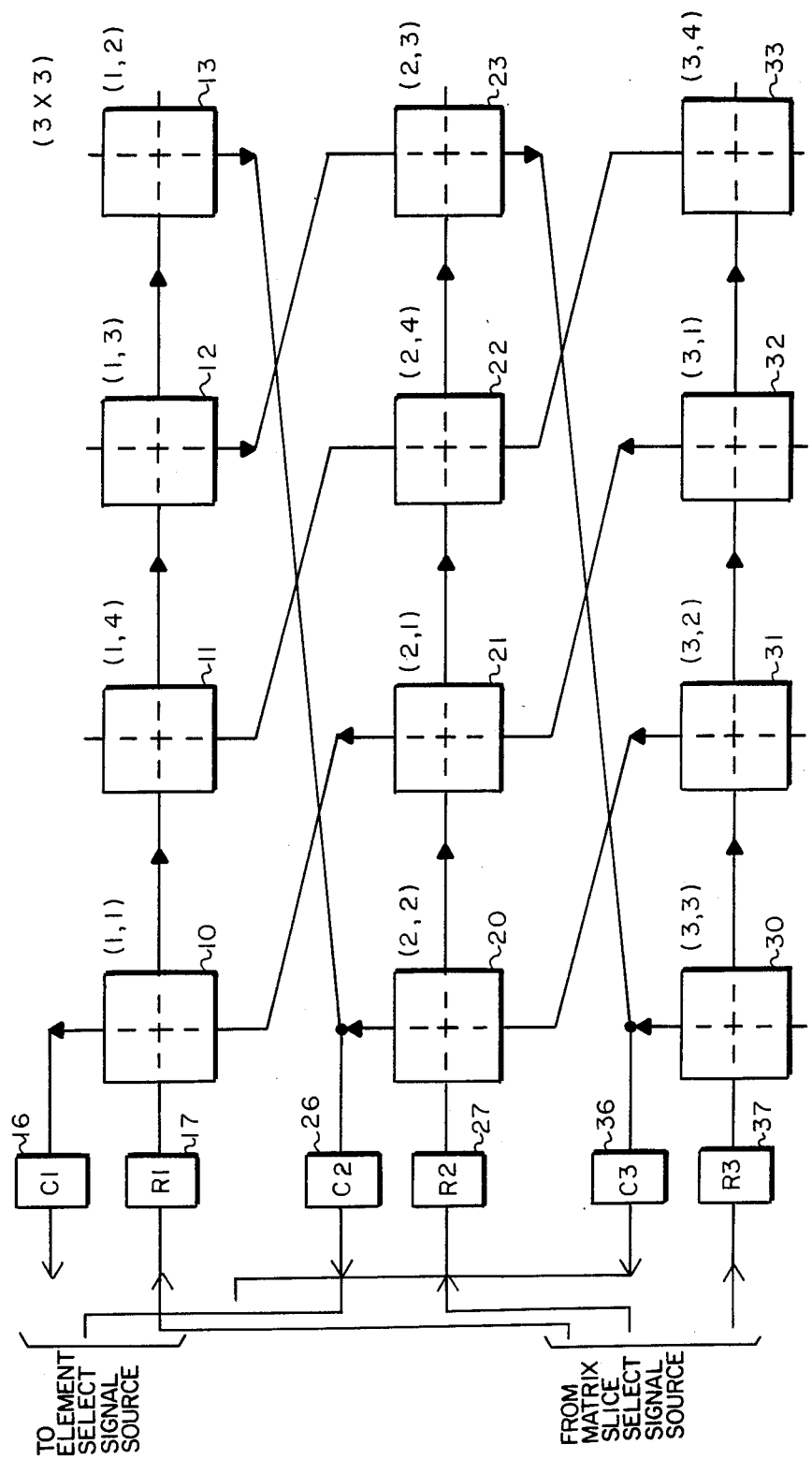
FIG. 3 is a schematic representation of the interconnection arrangement for a 3×3 matrix employing three matrix slices in accordance with the present invention.

A further expansion of the matrix can be realized by adding the third slice to form a matrix as represented in FIG. 3A. Turning to FIG. 3, a 3×3 matrix is implemented using the present invention. Element 30, the first element of the third slice is connected to element 23 the last element in slice 2 and also to element 12 the third element of slice 1. Additionally, element 31 is diagonally connected to element 20 and element 32 is diagonally connected to element 21. Therefore, it can be seen that column 1 of the present invention is comprised of element 10 in slice 1, element 21 in slice 2 and element 32 in slice 3. Column 2 comprises element 13 in slice 1, element 20 in slice 2 and element 31 in slice 3. Finally, column 3 comprises element 12 in slice 1, element 23 in slice 2 and element 30 in slice 3.

Elements 11, 22 and 33 are not connected at this time and would provide the fourth column element in each of the previous slices for column 4.

Adding the last slice to the 3×3 matrix shown in FIG. 3 would develop the complete 4×4 matrix represented in FIG. 4A.

Turning to FIG. 4 the completed 4×4 matrix is shown with all the elements of each row having connections to a row buffer and column buffer respectively. It can be readily seen that the three elements 11, 22 and 33 not terminated in FIG. 3, are now terminated to element 40 of slice 4.

It can be well appreciated by those skilled in the art that by varying the sizes of the slices; i.e. 4, 6, 8, 12, 16 elements and with each including a row and column buffer for each slice a matrix of addressable and/or switchable elements can be built up. It is believed that this technique allows a graceful expansion of a matrix without having the burden of providing a full grown matrix when the need of such a full grown matrix is not required.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A matrix of electronic elements comprising:
   a first matrix slice including a plurality of electronic elements connected serially to each other;
   first buffer means connected to a source of matrix slice select signals and to a first element of said plurality of electronic elements arranged to select said first matrix slice responsive to a matrix slice select signal;
   second buffer means connected to a source of element select signals and to said first electronic element arranged to select a first set of electronic elements responsive to an element select signal;
   at least one additional matrix slice including a plurality of electronic elements, a first electronic element of said first matrix slice diagonally connected to a second electronic element of said additional matrix slice, and each electronic element of said first matrix slice diagonally connected to a respective electronic element of said additional matrix slice in a similar manner as said first matrix slice first element, and said last electronic element of said first matrix slice diagonally connected to the first electronic element of said additional matrix slice;
   said additional matrix slice includes first buffer means connected to said source of matrix slice select signals and to said additional matrix slice, arranged to select said additional matrix slice responsive to a matrix slice select signal; and,
   said additional matrix slice includes second buffer means connected to said source of element select signals and to said additional matrix slice first element, arranged to select a second set of electronic elements responsive to a element select signal.

2. A matrix of electronic elements as claimed in claim 1, wherein: there is provided a plurality of matrix slices, with each matrix slice including a plurality of electronic elements and first and second buffer means, a first element of each matrix slice is diagonally connected to a respective second element of an adjacent matrix slice and each electronic element of each matrix slice diagonally connected to a respective electronic element of an adjacent matrix slice in a similar manner as said first first element and said second element, forming a plurality of electronic element sets, until each set is finally connected to the last electronic element of one of said plurality of matrix slice whereby, said last electronic element is diagonally connected to a first electronic element of the next adjacent matrix slice and to a respective second buffer means and a source of element select signals.

3. A matrix of electronic elements as claimed in claim 2, wherein said first buffer means is row buffer arranged to receive said row select signal, addressing all the elements contained in a respective matrix slice.

4. A matrix of electronic elements as claimed in claim 2, wherein said second buffer means is a column buffer arranged to receive said element select signal selecting one of said elements contained in a respective one of said electronic element sets.

* * * * *